(12) United States Patent
Harada et al.

(10) Patent No.: US 7,125,643 B2
(45) Date of Patent: Oct. 24, 2006

(54) POLYMERS, RESIST COMPOSITIONS AND PATTERNING PROCESS

(75) Inventors: Yuji Harada, Niigata-ken (JP); Jun Hatakeyama, Niigata-ken (JP); Yoshio Kawai, Niigata-ken (JP); Masaru Sasago, Hirakata (JP); Masayuki Endo, Izumi (JP); Shinji Kishimura, Itami (JP); Kazuhiko Maeda, Tokyo (JP); Haruhiko Komoriya, Kawagoe (JP); Kazuhiro Yamanaka, Kawagoe (JP)

(73) Assignees: Shin-Etsu Chemical Co., Ltd., Tokyo (JP); Matsushita Electric Industrial Co., Ltd., Kadoma (JP); Central Glass Co., Ltd., Ube (JP)

( * ) Notice: Subject to any disclaimer, the term of this patent is extended or adjusted under 35 U.S.C. 154(b) by 15 days.

(21) Appl. No.: 10/969,097

(22) Filed: Oct. 21, 2004

(65) Prior Publication Data
US 2005/0106499 A1 May 19, 2005

(30) Foreign Application Priority Data
Oct. 23, 2003 (JP) .............................. 2003-363181

(51) Int. Cl.
G03F 7/004 (2006.01)
G03F 7/30 (2006.01)
G08F 18/20 (2006.01)

(52) U.S. Cl. ................... 430/270.1; 430/326; 430/330; 430/907; 430/910; 526/246; 526/318

(58) Field of Classification Search ............. 430/270.1, 430/905, 907, 910, 326, 330; 526/245, 246, 526/318
See application file for complete search history.

(56) References Cited

U.S. PATENT DOCUMENTS
4,491,628 A 1/1985 Ito et al.
(Continued)

FOREIGN PATENT DOCUMENTS
JP 63-27829 A 2/1988
(Continued)

OTHER PUBLICATIONS
SPIE 2001, Proceedings 4345, pp. 273-284, Ito et al. "Polymer design for 157 nm chemically amplified resists".
(Continued)

*Primary Examiner*—John S. Chu
(74) *Attorney, Agent, or Firm*—Birch, Stewart, Kolasch & Birch, LLP

(57) ABSTRACT

A polymer comprising recurring units of formula (1) and recurring units of formulae (2a) to (2d) wherein $R^1$ is F or fluoroalkyl, $R^2$ is a single bond or an alkylene or fluoroalkylene, $R^3$ and $R^4$ are H, F, alkyl or fluoroalkyl, at least one of $R^3$ and $R^4$ contains F, $R^5$ is H or an acid labile group, $R^6$ is an acid labile group, adhesive group, alkyl or fluoroalkyl, and "a" is 1 or 2 is used as a base resin to formulate a resist composition which has advantages including high transparency to radiation having a wavelength of up to 200 nm, substrate adhesion, developer affinity and dry etching resistance.

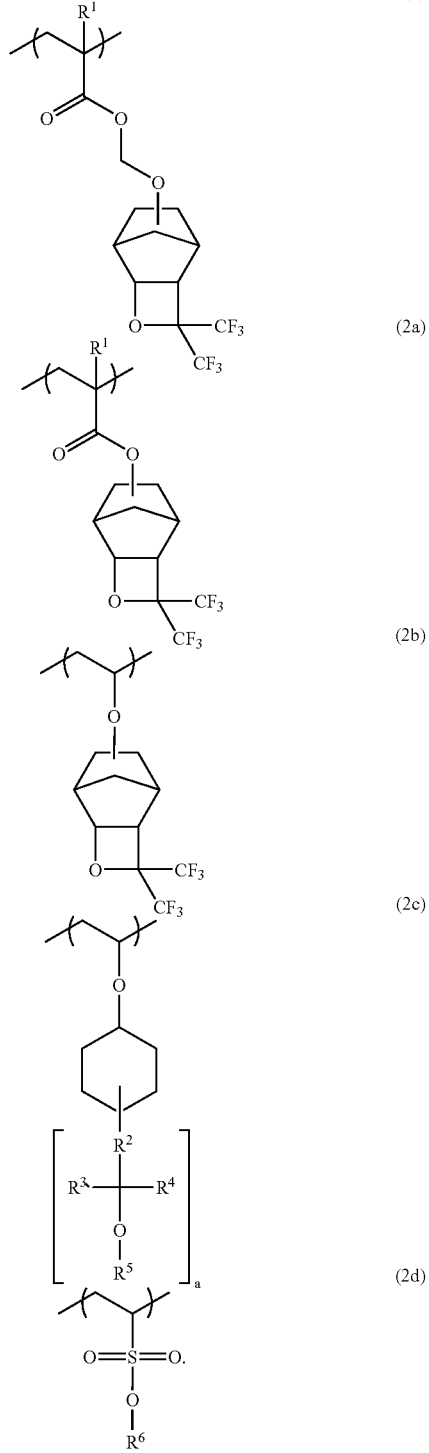

16 Claims, No Drawings

U.S. PATENT DOCUMENTS

| | | | |
|---|---|---|---|
| 5,310,619 A | | 5/1994 | Crivello et al. |
| 6,492,091 B1 | * | 12/2002 | Kodama et al. ......... 430/270.1 |
| 6,737,215 B1 | * | 5/2004 | Dammel et al. ......... 430/270.1 |
| 2004/0181023 A1 | * | 9/2004 | Yamagishi et al. ......... 526/319 |

FOREIGN PATENT DOCUMENTS

| | | |
|---|---|---|
| JP | 2-27660 B2 | 6/1990 |
| JP | 9-73173 A | 3/1997 |
| JP | 9-230595 A | 9/1997 |
| JP | 10-10739 A | 1/1998 |
| WO | WO 97/33198 | 9/1997 |

OTHER PUBLICATIONS

SPEI 2002, Proceedings 4690, pp. 76-83, Kodam et al. "Synthesis of Novel Fluoropolymer for 157 nm Photoresists by Cyclo-Polymerization".

* cited by examiner

POLYMERS, RESIST COMPOSITIONS AND PATTERNING PROCESS

CROSS-REFERENCE TO RELATED APPLICATION

This non-provisional application claims priority under 35 U.S.C. §119(a) on Patent Application No. 2003-363181 filed in Japan on Oct. 23, 2003, the entire contents of which are hereby incorporated by reference.

This invention relates to polymers useful as the base resin in resist compositions suited for microfabrication. It also relates to resist compositions, especially chemical amplification resist compositions comprising the polymers, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. To the demand for a resist material with a higher resolution and sensitivity, acid-catalyzed chemical amplification positive working resist materials are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Also, the change-over from i-line (365 nm) to shorter wavelength KrF laser (248 nm) brought about a significant innovation. Resist materials adapted for KrF excimer lasers enjoyed early use on the 0.30 micron process, went through the 0.25 micron rule, and currently entered the mass production phase on the 0.18 micron rule. Engineers have started investigation on the 0.10 micron rule, with the trend toward a finer pattern rule being accelerated.

For ArF laser (193 nm), it is expected to enable miniaturization of the design rule to 0.09 μm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ laser (157 nm) which is expected to enable further miniaturization to 0.07 μm or less, more difficulty arises in insuring transparency because it was found that acrylic resins which are used as the base resin for ArF are not transmissive to light at all and those cycloolefin resins having carbonyl bonds have strong absorption. It was also found that poly(vinyl phenol) which is used as the base resin for KrF has a window for absorption in proximity to 160 nm, so the transmittance is somewhat improved, but far below the practical level.

Since carbonyl groups and carbon-to-carbon double bonds have strong absorption in proximity to 157 nm as mentioned above, reducing the number of such units is considered to be one effective way for improving transmittance in proximity to 157 nm. It was recently found that introducing fluorine atoms into base polymers makes a great contribution to an improvement in transparency in the $F_2$ laser region. It was reported, for example, in SPIE 2001, Proceedings 4345, pp. 273–284, "Polymer design for 157 nm chemically amplified resists" that in resist compositions comprising a copolymer of tert-butyl α-trifluoromethylacrylate with 5-(2-hydroxy-2,2-bistrifluoromethyl)ethyl-2-norbornene and a copolymer of tert-butyl α-trifluoromethylacrylate with 4-(2-hydroxy-2,2-bistrifluoromethyl)methylstyrene, the absorbance of the polymer at 157 nm is improved to about 3. However, this resin is still insufficient in transparency because it is believed that an absorbance of 2 or less is necessary to form a rectangular pattern at a film thickness of at least 2,000 Å through $F_2$ exposure.

In this regard, a highly transparent resin having an absorbance of up to 1 is described in SPIE 2002, Proceedings 4690, pp. 76–83, "Synthesis of novel fluoropolymers for 157 nm photoresists by cyclo-polymerization." This polymer has not only high transparency, but also good substrate adherence and developer affinity. The drawback is its critically low resistance to dry etching as compared with general use polymers for KrF and ArF laser exposure.

SUMMARY OF THE INVENTION

An object of the invention is to provide a novel polymer having a high transmittance to radiation of up to 300 nm, especially from such light sources as KrF (248 nm), ArF (193 nm) and $F_2$ (157 nm) lasers, and thus useful as a base resin in a chemically amplified resist composition; a chemically amplified positive resist composition comprising the polymer; and a patterning process using the same.

It has been found that using a polymer comprising recurring units of the general formula (1) defined below, a resist composition, especially a chemically amplified resist composition which possesses a high resolution, high dry etching resistance, improved substrate adhesion and improved developer affinity while maintaining the high transparency of the resin can be formulated.

In one aspect, the present invention provides a polymer comprising recurring units of the general formula (1) and recurring units of at least one type selected from the general formulae (2a) to (2d).

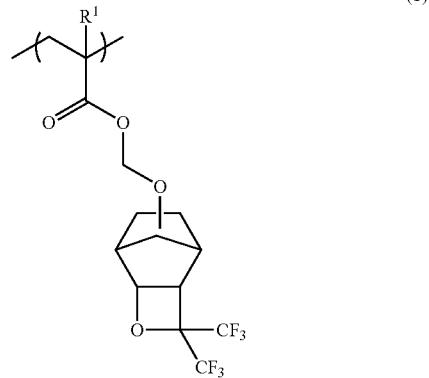

(1)

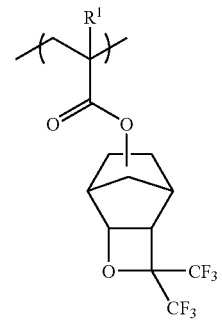

(2a)

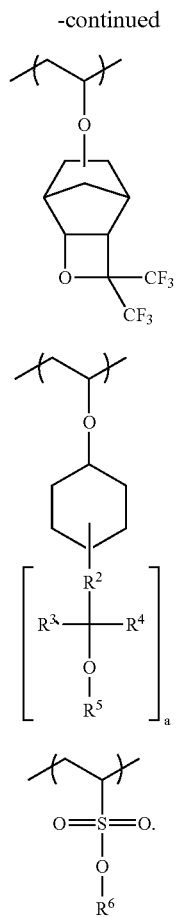
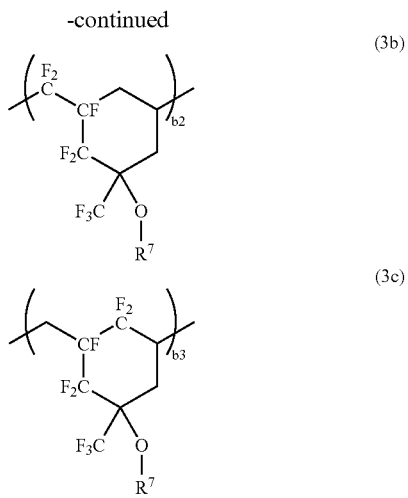

Herein $R^1$ is a fluorine atom or a fluorinated alkyl group of 1 to 4 carbon atoms, $R^2$ is a single bond or a straight, branched or cyclic alkylene or fluorinated alkylene group of 1 to 20 carbon atoms, $R^3$ and $R^4$ each are a hydrogen atom, a fluorine atom or a straight, branched or cyclic alkyl or fluorinated alkyl group of 1 to 20 carbon atoms, at least one of $R^3$ and $R^4$ contains at least one fluorine atom, $R^5$ is hydrogen or an acid labile group, $R^6$ is an acid labile group, an adhesive group or a straight, branched or cyclic alkyl or fluorinated alkyl group of 1 to 20 carbon atoms, and "a" is 1 or 2. The polymer has a weight average molecular weight of 1,000 to 500,000.

In another aspect, the present invention provides a resist composition comprising (A) the polymer defined above, and more preferably a resist composition comprising (A) a mixture of the polymer defined above and a polymer comprising recurring units of the general formulae (3a) to (3c).

Herein $R^7$ is hydrogen or an acid labile group, the subscripts b1, b2 and b3 are numbers satisfying $0<b1<1$, $0<b2<1$, $0\leq b3<1$, and $0<b1+b2+b3\leq 1$. The resist composition may further comprise (B) an organic solvent and (C) a photoacid generator, the composition being of chemical amplification positive type. The chemically amplified positive resist composition may further include (D) a basic compound and (E) a dissolution inhibitor.

In a further aspect, the present invention provides a process for forming a resist pattern comprising the steps of (1) applying the resist composition onto a substrate to form a coating, (2) heat treating the coating and then exposing it to high-energy radiation in a wavelength band of 100 to 180 nm or 1 to 30 nm through a photomask, and (3) optionally heat treating the exposed coating and developing it with a developer. Typically, the high-energy radiation is an $F_2$ laser beam, $Ar_2$ laser beam or soft x-ray.

The novel fluorinated cycloaliphatic polymer of the invention has high transparency to radiation having a wavelength of up to 200 nm, especially up to 160 nm, typically $F_2$ laser beam, possesses good substrate adhesion and dry etching resistance and offers high resolution. The resist composition is sensitive to high-energy radiation, exhibits a high sensitivity at a wavelength of up to 300 nm, typically up to 200 nm, and especially up to 160 nm. The introduction of hydrophilic fluorinated cycloaliphatic groups into the resin ensures satisfactory dry etching resistance without detracting from the transparency, substrate adhesion and developer affinity of the resin. These features of the inventive resist composition enable its use particularly as a resist having a low absorption at the exposure wavelength of a $F_2$ laser, and permit a finely defined pattern having sidewalls perpendicular to the substrate to be easily formed, making the resist ideal as a micropatterning material in VLSI fabrication.

DESCRIPTION OF THE PREFERRED EMBODIMENTS

One serious problem associated with resists for $F_2$ laser exposure is the transmittance of a base resin. Since those resins having substituent groups such as carbonyl groups and aromatic rings exhibit strong absorption in the $F_2$ region as previously pointed out, they are difficult to provide an absorbance of up to 2 required for the $F_2$ resists. The transmittance of a resin can be increased by introducing fluorine atoms therein. However, increasing the fluorine content to a sufficient level to insure transparency generally renders the resin more water repellent, which undesirably detracts from the substrate adhesion and developer affinity of the resin and even the dry etching resistance of the resin.

Polymer

The polymer or high molecular weight compound of the invention, sometimes referred to as Polymer I, is defined as comprising recurring units of the general formula (1) and recurring units of at least one type selected from the general formulae (2a) to (2d). Due to the presence of hydrophilic fluorinated units on side chains, the recurring units of formula (1) are effective for improving the transparency of the resin without detracting from substrate adhesion and developer affinity, with a high resolution and dry etching resistance being additionally expectable. Particularly when the recurring units of formula (1) are combined with the recurring units of formula (2a), (2b), (2c) or (2d), the resin is improved in transparency, dry etching resistance, substrate adhesion and developer affinity, offering a high resolution resist composition.

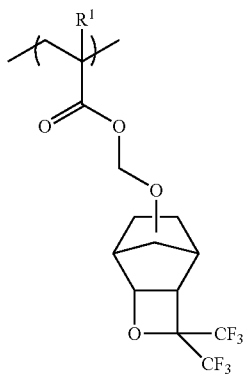

(1)

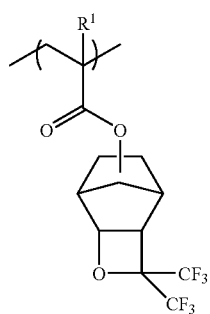

(2a)

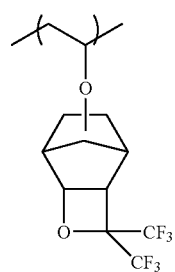

(2b)

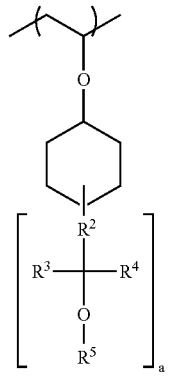

(2c)

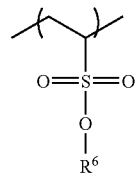

(2d)

Herein, $R^1$ is a fluorine atom or a fluorinated alkyl group of 1 to 4 carbon atoms. $R^2$ is a single bond or a straight, branched or cyclic alkylene or fluorinated alkylene group of 1 to 20 carbon atoms. $R^3$ and $R^4$ each are a hydrogen atom, a fluorine atom or a straight, branched or cyclic alkyl or fluorinated alkyl group of 1 to 20 carbon atoms. At least one of $R^3$ and $R^4$ contains at least one fluorine atom. $R^5$ is hydrogen or an acid labile group. $R^6$ is an acid labile group, an adhesive group or a straight, branched or cyclic alkyl or fluorinated alkyl group of 1 to 20 carbon atoms. The subscript "a" is 1 or 2.

Examples of straight, branched or cyclic alkyl groups of 1 to 20 carbon atoms include methyl, ethyl, n-propyl, isopropyl, n-butyl, sec-butyl, tert-butyl, cyclopentyl, cyclohexyl, cyclohexylmethyl, 2-ethylhexyl, n-octyl, 2-adamantyl and (2-adamantyl)methyl, with those groups having 1 to 10 carbon atoms being preferred.

The fluorinated alkyl groups correspond to the foregoing alkyl groups in which some or all of the hydrogen atoms are substituted with fluorine atoms, and include, for example, trifluoromethyl, 2,2,2-trifluoroethyl, 3,3,3-trifluoropropyl, 1,1,1,3,3,3-hexafluoroisopropyl and 1,1,2,2,3,3,3-heptafluoropropyl.

The straight, branched or cyclic alkylene groups of 1 to 20 carbon atoms correspond to the foregoing alkyl groups, with one hydrogen atom being eliminated therefrom. The fluorinated alkylene groups correspond to the foregoing alkylene groups in which some or all of the hydrogen atoms are substituted with fluorine atoms.

The acid labile groups represented by $R^5$ and $R^6$ are selected from a variety of such groups, preferably from among the groups of the following formulae (AL-1) to (AL-3). Of the acid labile groups of formulae (AL-1) to (AL-3), those having a cyclic structure are more effective for improving the etching resistance. They may have either a monocyclic structure or a bridged cyclic structure, with the bridged cyclic structure being most effective for improving the etching resistance. In general, acid labile groups having a cyclic structure are more labile, i.e., more susceptible to deblocking or elimination reaction, contributing to an improvement in contrast or the gamma value of dissolution characteristic.

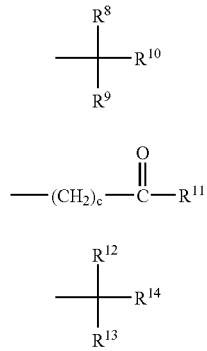

Herein, $R^8$, $R^9$ and $R^{10}$ may be the same or different and stand for straight, branched or cyclic hydrocarbon groups of 1 to 20 carbon atoms, which may contain a hetero atom such as oxygen, sulfur or nitrogen, or bridged cyclic hydrocarbon groups. Alternatively, a pair of $R^8$ and $R^9$, $R^8$ and $R^{10}$, and $R^9$ and $R^{10}$, taken together, may form a ring of 3 to 20 carbon atoms, preferably 5 to 15 carbon atoms, with the carbon atom to which they are bonded. $R^{11}$ and $R^{14}$ stand for straight, branched or cyclic alkyl groups of 1 to 20 carbon atoms, which may contain a hetero atom such as oxygen, sulfur, nitrogen or fluorine. $R^{12}$ and $R^{13}$ stand for hydrogen or straight, branched or cyclic alkyl groups of 1 to 20 carbon atoms, which may contain a hetero atom such as oxygen, sulfur, nitrogen or fluorine. Alternatively, a pair of $R^{12}$ and $R^{13}$, $R^{12}$ and $R^{14}$ and $R^{13}$ and $R^{14}$, taken together, may form a ring of 3 to 20 carbon atoms, preferably 5 to 15 carbon atoms, with the carbon atom to which they are bonded. The subscript c is an integer of 0 to 6.

In formula (AL-1), illustrative examples of $R^8$, $R^9$ and $R^{10}$ include methyl, ethyl, n-propyl, isopropyl, tert-butyl, cyclohexyl, cyclopentyl, norbornyl, adamantyl, and menthyl. The acid labile groups of formula (AL-1) are exemplified by the substituent groups shown below.

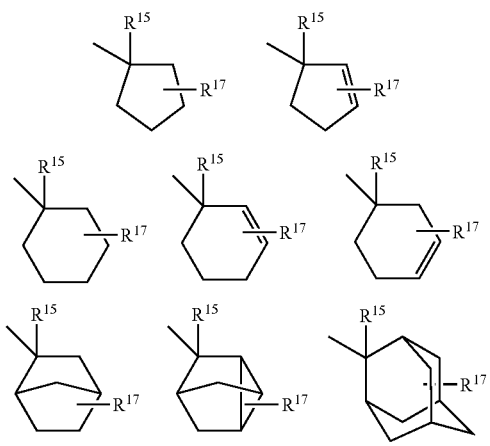

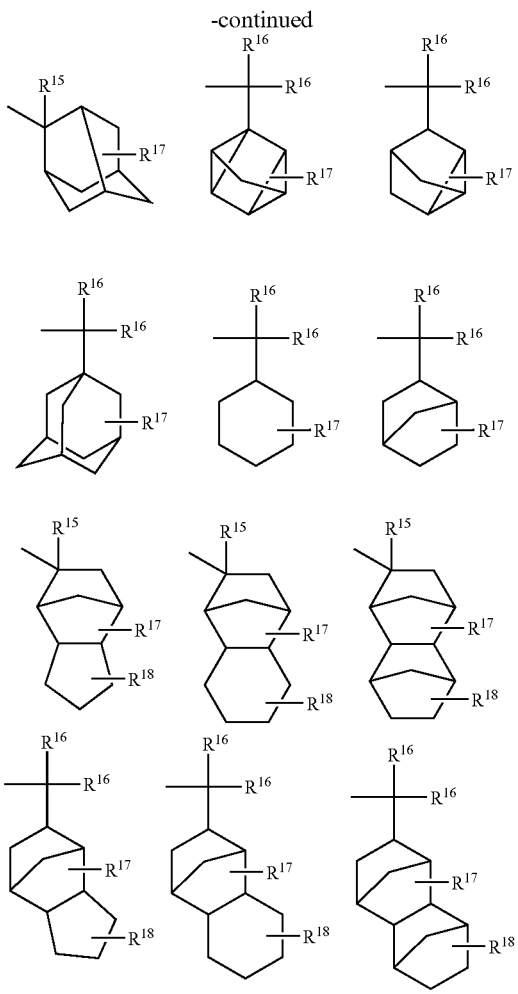

Herein, $R^{15}$ and $R^{16}$ stand for straight, branched or cyclic alkyl groups of 1 to 20 carbon atoms, preferably 1 to 15 carbon atoms. $R^{17}$ and $R^{18}$ stand for hydrogen or monovalent hydrocarbon groups of 1 to 6 carbon atoms, which may contain a hetero atom and which may be straight, branched or cyclic.

Illustrative examples of $R^{15}$ and $R^{16}$ include methyl, ethyl, propyl, isopropyl, n-butyl, sec-butyl, n-pentyl, n-hexyl, cyclopropyl, cyclopropylmethyl, cyclobutyl, cyclopentyl, and cyclohexyl. Illustrative of $R^{17}$ and $R^{18}$ are alkyl, hydroxyalkyl, alkoxy, and alkoxyalkoxy groups, examples of which include methyl, ethyl, n-propyl, isopropyl, n-butyl, sec-butyl, n-pentyl, n-hexyl, hydroxymethyl, hydroxyethyl, methoxy, methoxymethoxy, ethoxy, and tert-butoxy. When $R^{17}$ and $R^{18}$ contain hetero atoms such as oxygen, sulfur or nitrogen, they may be contained, for example, in the form of —OH, —OR$^{19}$, —O—, —S—, —S(=O)—, —NH$_2$, —NHR$^{19}$, —N(R$^{19}$)$_2$, —NH— or —NR$^{19}$— wherein $R^{19}$ is a $C_1$–$C_5$ alkyl group.

Illustrative examples of the acid labile groups of formula (AL-2) include
tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl, and 2-tetrahydrofuranyloxycarbonylmethyl as well as the substituent groups shown below.

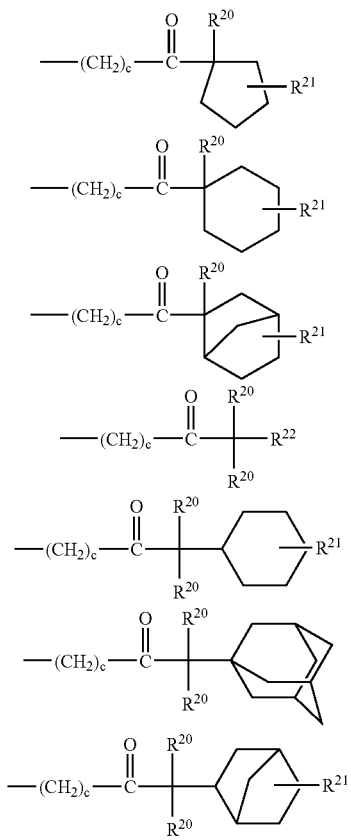

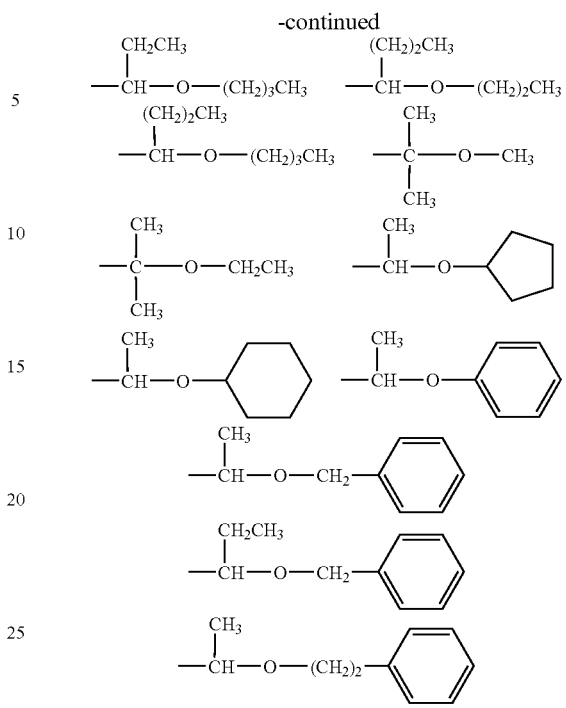

Herein, $R^{20}$ which may be the same or different is a straight, branched or cyclic alkyl group of 1 to 8 carbon atoms, or an aryl or aralkyl group of 6 to 20 carbon atoms. $R^{21}$ is hydrogen or a straight, branched or cyclic alkyl group of 1 to 20 carbon atoms. $R^{22}$ is a straight, branched or cyclic alkyl group of 2 to 20 carbon atoms, or an aryl or aralkyl group of 6 to 20 carbon atoms. The subscript c is an integer of 0 to 6.

Of the acid labile groups having formula (AL-3), the straight and branched groups are exemplified by the following groups.

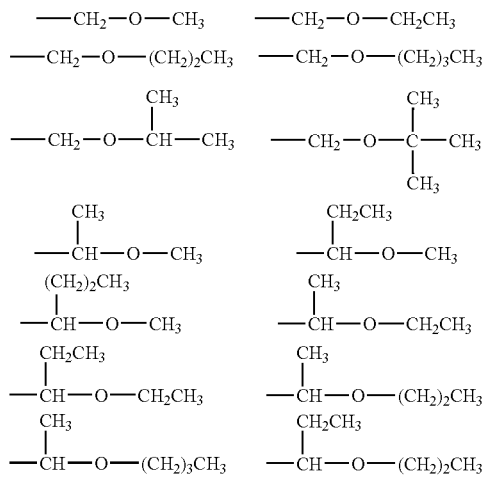

Of the acid labile groups having formula (AL-3), examples of the cyclic groups include tetrahydrofuran-2-yl, 2-methyltetrahydrofuran-2-yl, tetrahydropyran-2-yl, and 2-methyltetrahydropyran-2-yl.

Of the acid labile groups having formula (AL-3), those groups of the structure capable of providing intramolecular or intermolecular crosslinking to the base resin as represented by the following general formula are also useful.

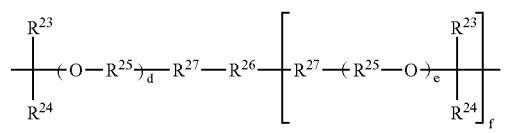

Herein, $R^{23}$ and $R^{24}$ are hydrogen or straight, branched or cyclic alkyl of 1 to 8 carbon atoms. $R^{23}$ and $R^{24}$, taken together, may form a ring, with the proviso that when they form a ring, each is a straight or branched alkylene of 1 to 8 carbon atoms. $R^{25}$ is a straight, branched or cyclic alkylene of 1 to 10 carbon atoms. $R^{26}$ is a (f+1)-valent aliphatic or alicyclic saturated hydrocarbon, aromatic hydrocarbon group or heterocyclic group having 1 to 50 carbon atoms which may be separated by a hetero atom, and in which some of the hydrogen atoms attached to the carbon atoms may be substituted with hydroxyl, carboxyl, carbonyl or fluorine. $R^{27}$ is —CO—O—, —NHCO—O— or —NH-CONH—. The subscripts d and e each are an integer from 0 to 10; and f is an integer from 1 to 7.

In the crosslinking acid labile groups, $R^{26}$ is preferably a di- to tetra-valent straight, branched or cyclic alkylene, alkyltriyl or alkyltetrayl group having 1 to 20 carbon atoms, or an arylene group having 6 to 30 carbon atoms. These groups may be separated by a hetero atom, and some of the hydrogen atoms attached to the carbon atoms thereof may be substituted with hydroxyl groups, carboxyl groups, acyl groups or halogen atoms. Preferably, d and e each are an integer from 0 to 5, and f is an integer from 1 to 3.

Preferred examples of the crosslinking acetal group are given below.

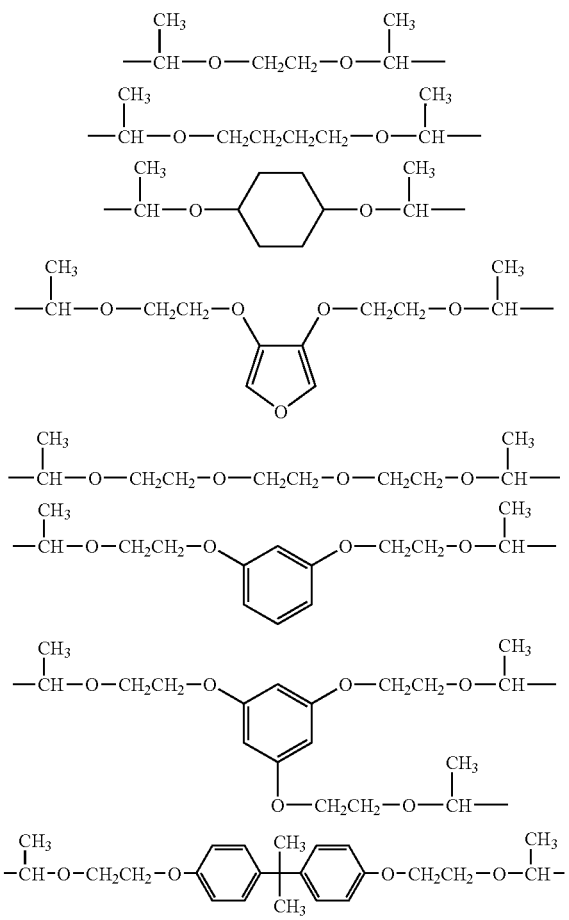

The adhesive group represented by $R^6$ is selected from a variety of such groups and preferably groups of the following formulae.

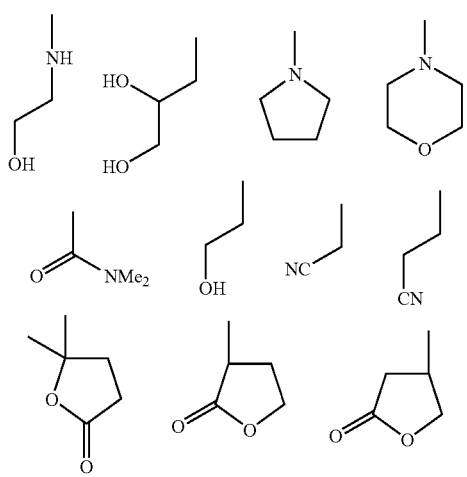

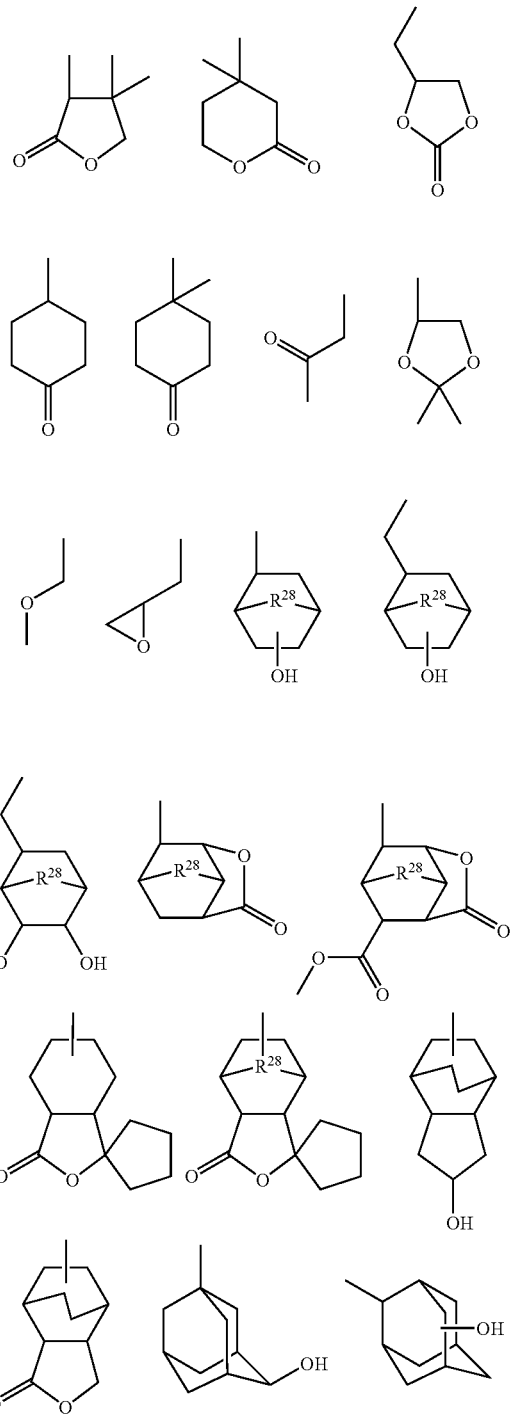

Herein, $R^{28}$ is a methylene group, oxygen atom or sulfur atom, and Me is methyl.

The monomer from which the recurring units of formula (1) are derived may be synthesized by reacting an acrylic acid having a fluorine-containing $R^1$ group with a chloride in the presence of a base as shown by the following scheme although the monomer synthesis is not limited to this process.

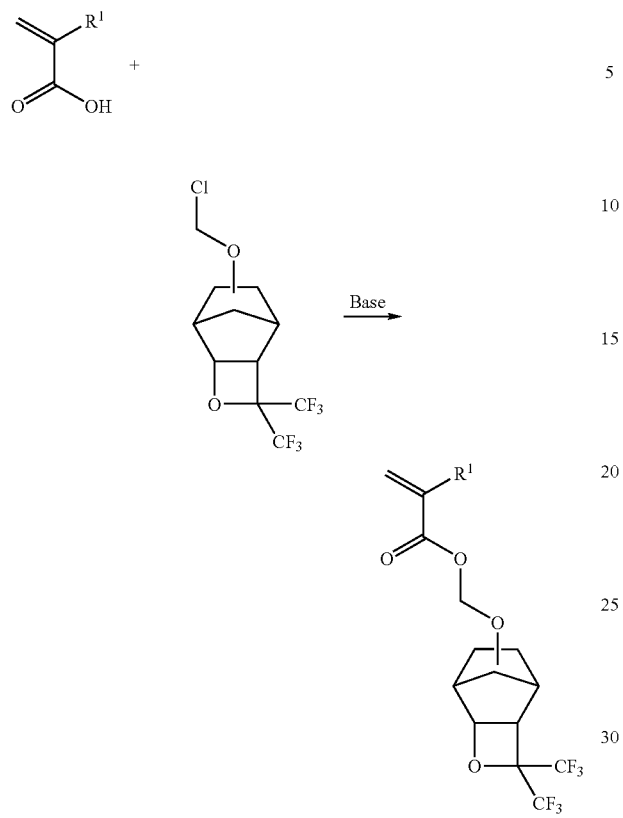

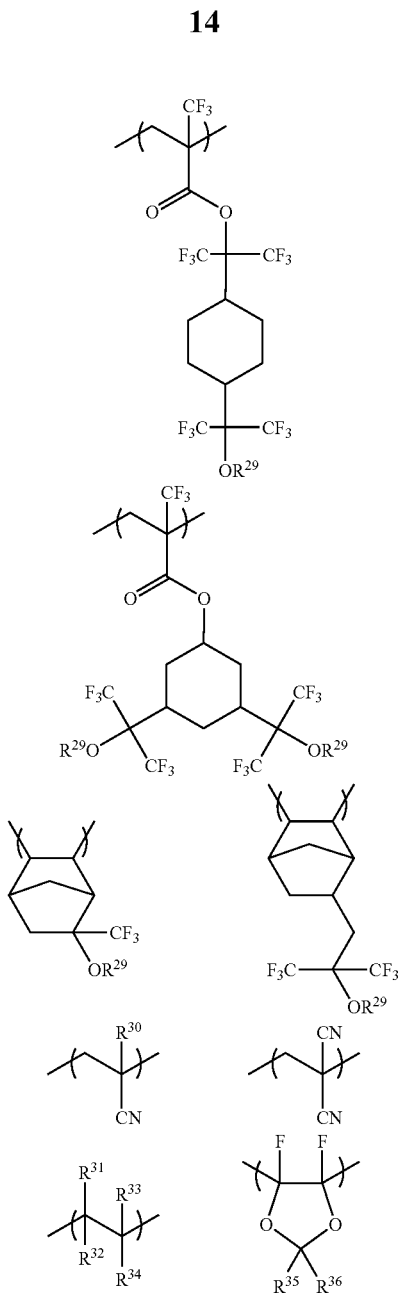

Herein, $R^1$ is a fluorine atom or a fluorinated alkyl group of 1 to 4 carbon atoms.

Suitable bases which can be used in the synthesis include sodium hydroxide, sodium carbonate, sodium hydrogen carbonate, potassium hydroxide, potassium carbonate, potassium hydrogen carbonate, sodium hydride, sodium methoxide, sodium ethoxide, sodium tert-butoxide, potassium tert-butoxide, triethylamine, diethylamine, piperidine, pyrrolidine, 1,8-diazabicyclo[5.4.0]-7-undecene, etc. The base is preferably used in an amount of 1 to 10 moles, more preferably 1 to 5 moles per mole of the acrylic acid.

A solvent may be used or not. If used, suitable solvents include hydrocarbons such as benzene, toluene and xylene; ethers such as diethyl ether, tetrahydrofuran and dioxane; halogenated hydrocarbons such as dichloromethane and chloroform; alkyl ketones such as acetone; and aprotic polar solvents such as N,N-dimethylformamide, dimethyl sulfoxide and hexamethylphosphoric acid triamide. Such solvents may be used in admixture.

The reaction temperature is usually in the range of −10° C. to 200° C. though not limited thereto. A temperature in the range of 0° C. to 50° C. is preferred for better yields.

In the polymer or resin comprising recurring units of formula (1) and recurring units of formulae (2a) to (2d), sometimes referred to as Polymer I, hereinafter, additional units as shown below may be incorporated for the purposes of improving properties including the dissolution characteristics of the resist and the substrate adhesion and transparency of the resin.

Herein, $R^{29}$ is hydrogen or an acid labile group as defined above. $R^{30}$ to $R^{34}$ each are hydrogen, fluorine or a fluoroalkyl group of 1 to 4 carbon atoms. At least one of $R^{30}$ to $R^{34}$ contains at least one fluorine atom. $R^{35}$ and $R^{36}$ each are hydrogen, methyl or trifluoromethyl.

In Polymer I wherein U1 stands for units of formula (1), U2 stands for units of formulae (2a) to (2d), and U3 stands for other units, the proportion of U1, U2 and U3, with the proviso that U1+U2+U3=1, is preferably determined so as to meet:

0<U1≦0.8, more preferably 0.1≦U1≦0.6,

0<U2≦0.8, more preferably 0.1≦U2≦0.6, and

0≦U3≦0.7, more preferably 0≦U3≦0.5.

Although Polymer I exerts satisfactory resist performance when used alone, a blend of Polymer I with Polymer II provides a resist composition with better transparency and dissolution characteristics. Polymer II is a resin comprising recurring units of the following general formulae (3a) to (3c).

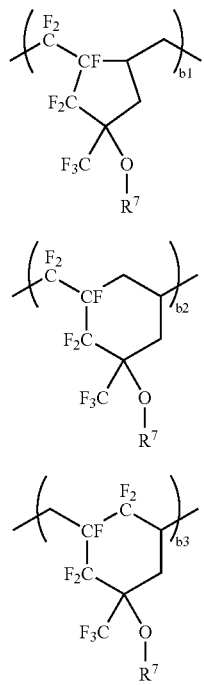

Herein, $R^7$ is hydrogen or an acid labile group, the subscripts b1, b2 and b3 are numbers satisfying $0<b1$, $0<b2<1$, $0\leq b3<1$, and $0<b1+b2+b3\leq 1$.

In Polymer II, the acid labile group represented by $R^7$ may be selected from the groups of formulae (AL-1) to (AL-3) described above. The acid labile group may be introduced into $R^7$ by a method of previously introducing an acid labile group into a monomer, followed by polymerization or a method of polymerizing a monomer wherein $R^7$ is hydrogen and then substituting acid labile groups for hydrogen atoms of hydroxyl groups. In the post-substitution method, modification can be performed by reacting sodium hydride, potassium tert-butoxide or the like with the polymer to convert acidic hydroxyl groups into anions, then reacting with a corresponding halide although the modification is not limited thereto. The percent substitution with acid labile groups in Polymer II is in the range of 1 to 50 mol%, desirably 5 to 40 mol% of the entire $R^7$ groups.

Next, the synthesis of polymers is described. For the synthesis of Polymer I, a monomer corresponding to the units of formula (1), a monomer corresponding to the units of formulae (2a) to (2d), and optionally a transparency-improving monomer are used. For the synthesis of Polymer II, a monomer as shown below and optional other monomers are used.

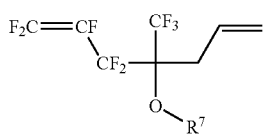

($R^7$ is hydrogen or an acid labile group.)

In either case, the polymer is generally synthesized by dissolving monomers in a solvent, adding a catalyst thereto, and effecting polymerization reaction while heating or cooling the system if necessary.

The polymerization reaction depends on the type of initiator or catalyst, trigger means (including light, heat, radiation and plasma), and polymerization conditions (including temperature, pressure, concentration, solvent, and additives). Commonly used for preparation of Polymers I and II is radical copolymerization of triggering polymerization with radicals of 2,2'-azobisisobutyronitrile (AIBN) or the like. The polymerization may be carried out in a conventional manner.

The initiator used for radical polymerization is not critical. Exemplary initiators include azo compounds such as AIBN, 2,2'-azobis(4-methoxy-2,4-dimethylvaleronitrile), 2,2'-azobis(2,4-dimethylvaleronitrile), and 2,2'-azobis(2,4,4-trimethylpentane); and peroxide compounds such as tert-butyl peroxypivalate, lauroyl peroxide, benzoyl peroxide and tert-butyl peroxylaurate. Water-soluble initiators include persulfate salts such as potassium persulfate, and redox combinations of potassium persulfate or peroxides such as hydrogen peroxide with reducing agents such as sodium sulfite. The amount of the polymerization initiator used is determined as appropriate in accordance with such factors as the identity of initiator and polymerization conditions, although the amount is often in the range of about 0.001 to 5% by weight, especially about 0.01 to 2% by weight based on the total weight of monomers to be polymerized.

For the polymerization reaction, a solvent may be used. The polymerization solvent used herein is preferably one which does not interfere with the polymerization reaction. Typical solvents include ester solvents such as ethyl acetate and n-butyl acetate, ketone solvents such as acetone, methyl ethyl ketone and methyl isobutyl ketone, aliphatic or aromatic hydrocarbon solvents such as toluene, xylene and cyclohexane, alcohol solvents such as isopropyl alcohol and ethylene glycol monomethyl ether, and ether solvents such as diethyl ether, dioxane, and tetrahydrofuran (THF). These solvents may be used alone or in admixture of two or more. Further, any of well-known molecular weight modifiers such as dodecylmercaptan may be used in the polymerization system.

The temperature of polymerization reaction varies in accordance with the identity of polymerization initiator and the boiling point of the solvent although it is often preferably in the range of about 20 to 200° C., and especially about 50 to 140° C. Any desired reactor or vessel may be used for the polymerization reaction.

From the solution or dispersion of the polymer thus obtained, the organic solvent or water serving as the reaction medium is removed by any of well-known techniques. Suitable techniques include, for example, re-precipitation followed by filtration, and heat distillation under vacuum.

Desirably the polymers, especially Polymer I, have a weight average molecular weight (Mw) of about 1,000 to about 500,000, and especially about 2,000 to about 100,000. Note that the Mw is determined by gel permeation chromatography (GPC) using polystyrene standards.

In the synthesis of Polymer I, the proportion of recurring units in the resin can be altered by changing the ratio of monomer charges.

The compositional ratios b1, b2 and b3 of Polymer II can be altered by changing polymerization reaction conditions.

It is necessary that the ratios satisfy $0<b1<1$, $0<b2<1$, $0\leq b3<1$, and preferably each of b1, b2 and b3 is in the range of 0.1 to 0.8. The ratios should satisfy 0<b1+b2+b3≦1, and preferably 0.6≦b1+b2+b3<1. In case of b1+b2+b3<1, the balance may be units of acrylic acid derivatives styrene derivatives, vinyl ether derivatives, norbornene derivatives, fluoroethylene derivatives or the like, though not limited thereto. At this point, the transparency of the entire polymer can be increased by introducing fluorine atoms into the balance units, or the dissolution characteristics of the polymer can be improved by introducing a substituent group in the form of a fluoroalcohol or fluoroalcohol whose hydroxyl group is blocked into the balance units.

The polymer of the invention, Polymer I or a blend of Polymers I and II, can be used as a base resin in resist compositions, specifically chemical amplification type resist compositions, and especially chemical amplification type positive working resist compositions. It is understood that the polymer of the invention may be admixed with another polymer for the purpose of altering the dynamic properties, thermal properties, alkali solubility and other physical properties of polymer film. The type of the other polymer which can be admixed is not critical. Any of polymers known to be useful in resist use may be admixed in any desired proportion.

Resist Composition

As long as the polymer of the invention is used as a base resin, the resist composition of the invention may be prepared using well-known components. In a preferred embodiment, the chemically amplified positive resist composition is defined as comprising (A) the above-defined polymer (i.e., Polymer I or a blend of Polymers I and II) as a base resin, (B) an organic solvent, and (C) a photoacid generator. In the resist composition, there may be further formulated (D) a basic compound and/or (E) a dissolution inhibitor.

Component (B)

The organic solvent used as component (B) in the invention may be any organic solvent in which the base resin (inventive polymer), photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone.

Also useful are fluorinated organic solvents. Examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluorobutyrate, ethyl heptafluoroethanol, ethyl heptafluorobutylacetate, ethyl hexafluoroglutarylmethyl, ethyl 3-hydroxy-4,4,4-trifluoroacetoacetate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluoropyruvate, sec-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro-2,5-dimethyl-3,6-dioxane anionic acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluoro0trihexylamine, perfluoro-2,5,8-trimethyl-3,6,9,12,15-pentaoxaoctadecane, methyl perfluoro-2,5,8-trimethyl-3,6,9-trioxadodecanoate, perfluorotripentylamine, perfluorotriisopropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexane, propylene glycol trifluoromethyl ether, butyl trifluoroacetate, and 1,1,1-trifluoro-5,5-dimethyl-2,4-hexanedione.

These solvents may be used alone or in combinations of two or more thereof. Of the above organic solvents, preferred are diethylene glycol dimethyl ether and 1-ethoxy-2-propanol, in which the photoacid generator is most soluble, and propylene glycol monomethyl ether acetate which is safe, and mixtures thereof.

The solvent is preferably used in an amount of about 300 to 10,000 parts by weight, more preferably about 500 to 5,000 parts by weight per 100 parts by weight of the base resin.

Component (C)

The acid generators used herein include
(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.

(i) Onium Salts of Formula (P1a-1) or (P1a-2):

(P1a-1)

(P1a-2)

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

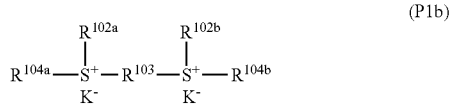

(P1b)

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (Pla-1) and (Pla-2).

(ii) Diazomethane Derivatives of Formula (P2)

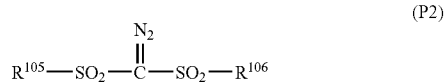

(P2)

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

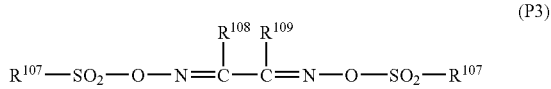

(P3)

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

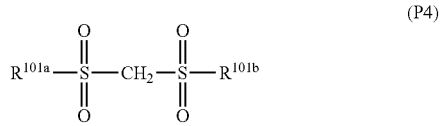

(P4)

Herein, $R^{101a}$ and $R^{101b}$ are as defined above.

(v) Sulfonic Acid Esters of N-Hydroxyimide Compounds of Formula (P5)

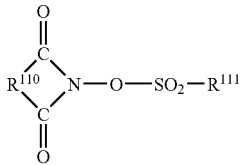

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the acid generator include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfone derivatives such as 2-cyclohexylcarbonyl-2-(p-toluenesulfonyl)propane and 2-isopropylcarbonyl-2-(p-toluenesulfonyl)propane;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate.

Preferred among these acid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl) sulfonium trifluoromethanesulfonate, and 1,2'-naphthylcarbonylmethyltetrahydrothiophenium triflate;

diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane;

glyoxime derivatives such as bis-O-(p-toluenesulfonyl)-α-dimethylglyoxime and bis-O-(n-butanesulfonyl)-α-dimethylglyoxime;

bissulfone derivatives such as bisnaphthylsulfonylmethane;

and sulfonic acid esters of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These acid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The acid generator is preferably added in an amount of 0.1 to 50 parts by weight, and especially 0.5 to 40 parts by weight, per 100 parts by weight of the base polymer. Less than 0.1 pbw of the acid generator may generate an insufficient amount of acid upon light exposure, resulting in a low sensitivity and resolution. More than 50 pbw of the acid generator may lower the transmittance of the resist and result in a poor resolution.

Component (D)

The basic compound (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-isopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in a mixture.

In the formulas, n is 1, 2 or 3. The side chain X may be the same or different and is represented by the formula (X)-1, (X)-2 or (X)-3. The side chain Y may be the same or different and stands for hydrogen or a straight, branched or cyclic alkyl group of 1 to 20 carbon atoms which may contain an ether or hydroxyl group. Two or three X's may bond together to form a ring.

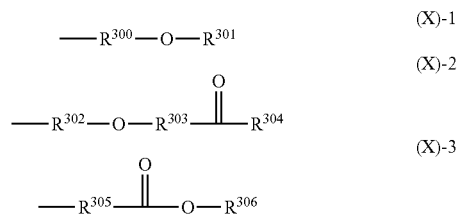

In the formulas, $R^{300}$, $R^{302}$ and $R^{305}$ are independently straight or branched alkylene groups of 1 to 4 carbon atoms; $R^{301}$ and $R^{304}$ are independently hydrogen or straight, branched or cyclic alkyl groups of 1 to 20 carbon atoms, which may contain at least one hydroxyl group, ether, ester or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl group, ether, ester or lactone ring.

Illustrative, non-limiting examples of the compounds of formula (B)-1 include
tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)

ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing basic compounds having the following general formula (B)-2.

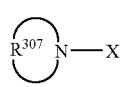
(B)-2

Herein X is as defined above, and $R^{307}$ is a straight or branched alkylene group of 2 to 20 carbon atoms which may contain one or more carbonyl, ether, ester or sulfide groups.

Illustrative examples of the cyclic structure-bearing basic compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-containing basic compounds having the following general formulae (B)-3 to (B)-6 may be blended.

(B)-3

(B)-4

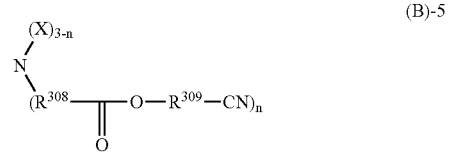
(B)-5

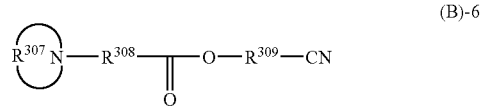
(B)-6

Herein, X, $R^{307}$ and n are as defined above, and $R^{308}$ and $R^{309}$ each are independently a straight or branched alkylene group of 1 to 4 carbon atoms.

Illustrative examples of the cyano-containing basic compounds include
3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2- formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

These basic compounds may be used alone or in admixture of any. The basic compound is preferably formulated in an amount of 0.001 to 2 parts, and especially 0.01 to 1 part by weight, per 100 parts by weight of the base resin. Less than 0.001 part of the basic compound may fail to achieve the desired effects thereof, while the use of more than 2 parts would result in too low a sensitivity.

Component (E)

The dissolution inhibitor (E) is preferably selected from compounds possessing a weight average molecular weight of 100 to 1,000 and having on the molecule at least two phenolic hydroxyl groups, in which an average of from 10 to 100 mol % of all the hydrogen atoms on the phenolic hydroxyl groups are replaced by acid labile groups.

Illustrative, non-limiting, examples of the dissolution inhibitor (E) which are useful herein include bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)-valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, and 1,1,2-tris(4'-(1'-ethoxypropyloxy)phenyl)ethane.

The compounds serving as dissolution inhibitor have a weight average molecular weight of 100 to 1,000, preferably 150 to 800. An appropriate amount of the dissolution inhibitor (E) is 0 to about 50 parts, preferably about 5 to 50 parts, and especially about 10 to 30 parts by weight per 100 parts by weight of the base resin. Less amounts of the dissolution inhibitor may fail to yield an improved resolution, whereas too much amounts would lead to slimming of the patterned film, and thus a decline in resolution. The inhibitor may be used singly or as a mixture of two or more thereof.

The resist composition of the invention may include optional ingredients, typically a surfactant which is commonly used for improving the coating characteristics. Optional ingredients may be added in conventional amounts so long as this does not compromise the objects of the invention.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dai-Nippon Ink & Chemicals, Inc.), Fluorad FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays, excimer laser beams, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5 wt %, and preferably 2 to 3 wt %, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate.

Of the various types of high-energy radiation that may be used, the resist composition of the invention is best suited to micro-pattern formation with, in particular, deep-UV rays having a wavelength of 254 to 120 nm, a laser, especially KrF laser (248 nm), ArF laser (193 nm), F$_2$ laser (157 nm), Kr$_2$ laser (146 nm), KrAr laser (134 nm) or Ar$_2$ laser (126 nm), x-rays, or an electron beam. Recommended is exposure to high-energy radiation in a wavelength band of 100 to 180 nm or 1 to 30 nm, specifically F$_2$ laser beam, Ar$_2$ laser beam or soft x-ray. The desired pattern may not be obtainable outside the upper and lower limits of the above range.

EXAMPLE

Examples of the invention are given below by way of illustration and not by way of limitation. The abbreviations used herein are AIBN for 2,2'-azobisisobutyronitrile, GPC for gel permeation chromatography, NMR for nuclear magnetic resonance, Mw for weight average molecular weight, Mn for number average molecular weight, Mw/Mn for molecular weight distribution or dispersity, THF for tetrahydrofuran, and PGMEA for propylene glycol monomethyl ether acetate. For all polymers, Mw and Mn are determined by GPC systems HLC-8120 and HLC-8220 (by Tosoh Corp.).

Synthesis Example 1

Copolymerization of Monomer 1, Monomer 2 and Monomer 3 (0.4:0.3:0.3)

A 500-ml flask was charged with 8.00 g of Monomer 1, 5.58 g of Monomer 2 and 6.42 g of Monomer 3, all shown below, which were dissolved in 6.67 g of ethyl acetate. The system was fully purged of oxygen, charged with 0.230 g of the initiator AIBN, and heated at 60° C. at which polymerization reaction took place for 24 hours.

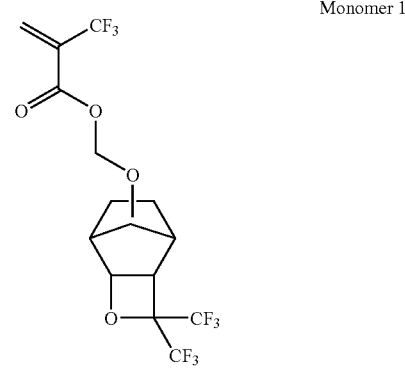

Monomer 1

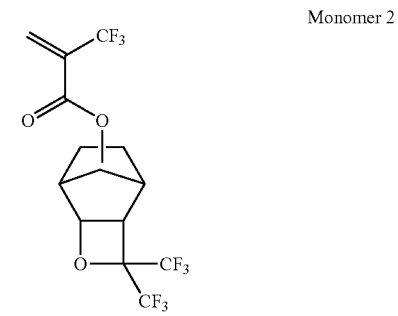

Monomer 2

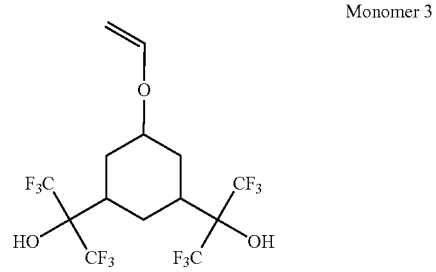

Monomer 3

The polymer thus obtained was worked up by pouring the reaction mixture into hexane whereupon the polymer precipitated. The procedure of dissolving the polymer in THF and pouring into hexane for precipitation was repeated twice, after which the polymer was separated and dried. There was obtained 14.0 g of a white polymer, designated Polymer 1, which was found to have a Mw of 9,800 and a dispersity (Mw/Mn) of 1.7 as determined by GPC. On $^1$H-NMR and $^{19}$F-NMR analysis, Polymer 1 was found to consist of respective units derived from Monomer 1, Monomer 2 and Monomer 3 in a molar ratio of 0.36:0.31:0.33.

Synthesis Example 2

Copolymerization of Monomer 1, Monomer 3 and Monomer 4 (0.4:0.3:0.3)

A 500-ml flask was charged with 7.21 g of Monomer 1, 5.79 g of Monomer 3 and 7.00 g of Monomer 4, shown below, which were dissolved in 6.67 g of ethyl acetate. The system was fully purged of oxygen, charged with 0.207 g of the initiator AIBN, and heated at 60° C. at which polymerization reaction took place for 24 hours.

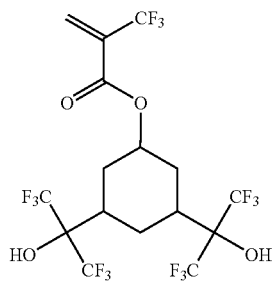

Monomer 4

The polymer thus obtained was worked up by pouring the reaction mixture into hexane whereupon the polymer precipitated. The procedure of dissolving the polymer in THF and pouring into hexane for precipitation was repeated twice, after which the polymer was separated and dried. There was obtained 13.7 g of a white polymer, designated Polymer 2, which was found to have a Mw of 11,000 and a dispersity (Mw/Mn) of 1.7 as determined by GPC. On $^1$H-NMR and $^{19}$F-NMR analysis, Polymer 2 was found to consist of respective units derived from Monomer 1, Monomer 3 and Monomer 4 in a molar ratio of 0.38:0.31:0.31.

Synthesis Example 3

Copolymerization of Monomer 1, Monomer 2 and Monomer 5 (0.4:0.3:0.3)

A 500-ml flask was charged with 9.18 g of Monomer 1, 6.41 g of Monomer 2 and 4.41 g of Monomer 5, shown below, which were dissolved in 6.67 g of ethyl acetate. The system was fully purged of oxygen, charged with 0.264 g of the initiator AIBN, and heated at 60° C. at which polymerization reaction took place for 24 hours.

Monomer 5

The polymer thus obtained was worked up by pouring the reaction mixture into hexane whereupon the polymer precipitated. The procedure of dissolving the polymer in THF and pouring into hexane for precipitation was repeated twice, after which the polymer was separated and dried. There was obtained 12.7 g of a white polymer, designated Polymer 3, which was found to have a Mw of 10,500 and a dispersity (Mw/Mn) of 1.7 as determined by GPC. On $^1$H-NMR and $^{19}$F-NMR analysis, Polymer 3 was found to consist of respective units derived from Monomer 1, Monomer 2 and Monomer 5 in a molar ratio of 0.35:0.30:0.35.

Synthesis Example 4

Copolymerization of Monomer 1, Monomer 4, Monomer 5 and Monomer 6 (0.3:0.3:0.3:0.1)

A 500-ml flask was charged with 6.38 g of Monomer 1, 8.26 g of Monomer 4, 4.08 g of Monomer 5, and 1.28 g of Monomer 6, shown below, which were dissolved in 6.67 g of ethyl acetate. The system was fully purged of oxygen, charged with 0.245 g of the initiator AIBN, and heated at 60° C. at which polymerization reaction took place for 24 hours.

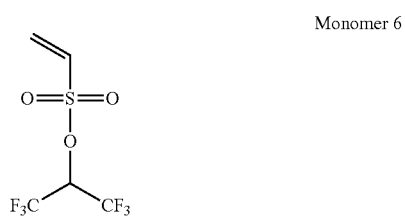

Monomer 6

The polymer thus obtained was worked up by pouring the reaction mixture into hexane whereupon the polymer precipitated. The procedure of dissolving the polymer in THF and pouring into hexane for precipitation was repeated twice, after which the polymer was separated and dried. There was obtained 13.3 g of a white polymer, designated Polymer 4, which was found to have a Mw of 9,500 and a dispersity (Mw/Mn) of 1.7 as determined by GPC. On $^1$H-NMR and $^{19}$F-NMR analysis, Polymer 4 was found to consist of respective units derived from Monomer 1, Monomer 4, Monomer 5 and Monomer 6 in a molar ratio of 0.31:0.28:0.33:0.08.

Synthesis Example 5

Copolymerization of Monomer 1, Monomer 4 and Monomer 7 (0.4:0.3:0.3)

A 500-ml flask was charged with 8.00 g of Monomer 1, 7.77 g of Monomer 4 and 4.23 g of Monomer 7, shown below, which were dissolved in 6.67 g of ethyl acetate. The system was fully purged of oxygen, charged with 0.230 g of the initiator AIBN, and heated at 60° C. at which polymerization reaction took place for 24 hours.

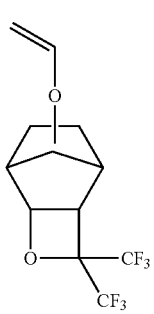

Monomer 7

The polymer thus obtained was worked up by pouring the reaction mixture into hexane whereupon the polymer precipitated. The procedure of dissolving the polymer in THF and pouring into hexane for precipitation was repeated twice, after which the polymer was separated and dried.

There was obtained 12.9 g of a white polymer, designated Polymer 5, which was found to have a Mw of 12,500 and a dispersity (Mw/Mn) of 1.7 as determined by GPC. On $^1$H-NMR and $^{19}$F-NMR analysis, Polymer 5 was found to consist of respective units derived from Monomer 1, Monomer 4 and Monomer 7 in a molar ratio of 0.37:0.30:0.33.

Evaluation

Polymer Transmittance Measurement

The polymers obtained in Synthesis Examples 1 to 5, designated Polymers 1 to 5, respectively, and Polymer 6 shown below (FPR-200 by Asahi Glass Co., Ltd., Mw=14,000, Mw/Mn=2.5) were determined for transmittance.

Polymer 6

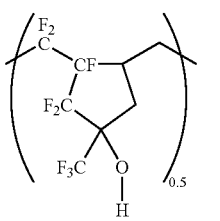

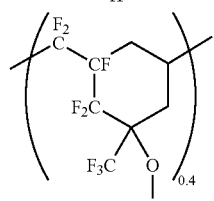

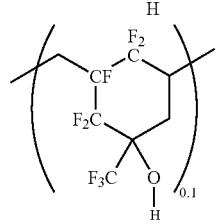

Three other polymers were furnished for comparison purposes. Comparative Polymer 1 is a monodisperse polyhydroxystyrene having a Mw of 10,000 and a dispersity (Mw/Mn) of 1.1 in which 30 mol % of hydroxyl groups are replaced by tetrahydropyranyl groups. Similarly, Comparative Polymer 2 is polymethyl methacrylate having a Mw of 15,000 and a dispersity (Mw/Mn) of 1.7; and Comparative Polymer 3 is a novolac polymer having a meta/para ratio of 40/60, a Mw of 9,000 and a dispersity (Mw/Mn) of 2.5.

Each polymer, 1 g, was thoroughly dissolved in 20 g of PGMEA, and passed through a 0.2-μm filter, obtaining a polymer solution. The polymer solution was spin coated onto a MgF$_2$ substrate and baked on a hot plate at 100° C. for 90 seconds, forming a polymer film of 100 nm thick on the substrate. Using a vacuum ultraviolet spectrometer (VUV-200S by Nihon Bunko Co., Ltd.), the polymer film was measured for transmittance at 248 nm, 193 nm and 157 nm. The results are shown in Table 1.

TABLE 1

|  | Transmittance (%) | | |
| --- | --- | --- | --- |
|  | 248 nm | 193 nm | 157 nm |
| Polymer 1 | 93 | 91 | 71 |
| Polymer 2 | 92 | 92 | 76 |

TABLE 1-continued

|  | Transmittance (%) | | |
| --- | --- | --- | --- |
|  | 248 nm | 193 nm | 157 nm |
| Polymer 3 | 93 | 91 | 65 |
| Polymer 4 | 93 | 91 | 68 |
| Polymer 5 | 93 | 90 | 72 |
| Polymer 6 | 93 | 91 | 89 |
| Polymer 6 + Polymer 1 (70/30)* | 92 | 92 | 76 |
| Polymer 6 + Polymer 2 (70/30)* | 92 | 92 | 80 |
| Polymer 6 + Polymer 3 (70/30)* | 93 | 91 | 72 |
| Polymer 6 + Polymer 4 (70/30)* | 93 | 91 | 74 |
| Polymer 6 + Polymer 5 (70/30)* | 93 | 91 | 76 |
| Comparative Polymer 1 | 90 | 5 | 15 |
| Comparative Polymer 2 | 91 | 80 | 12 |
| Comparative Polymer 3 | 82 | 6 | 17 |

*mixing ratio by weight

It is evident from Table 1 that resist materials using the inventive polymers maintain sufficient transparency at the F$_2$ laser wavelength (157 nm).

Resist Preparation and Exposure

Resist solutions were prepared in a conventional manner by dissolving amounts as shown in Table 2 of the polymer, photoacid generator (PAG1 or PAG2), basic compound, and dissolution inhibitor (DRI1) in 1,000 parts of PGMEA.

PAG1

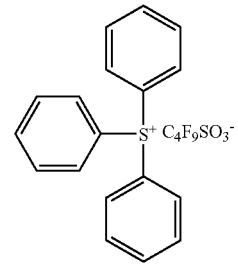

PAG2

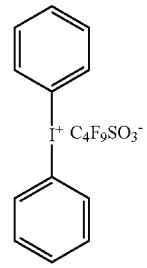

DRI1

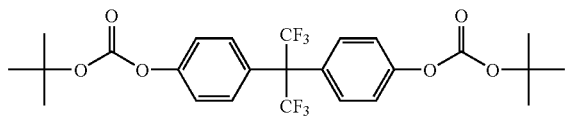

TMMEA

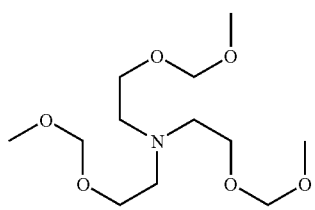

-continued

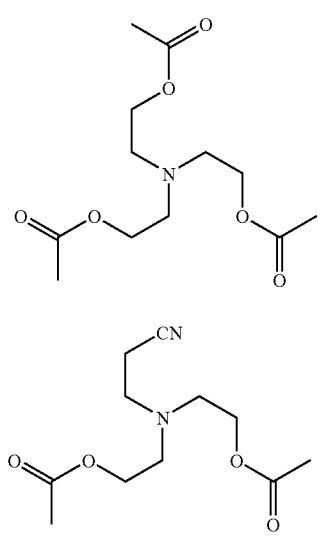

AAA

AACN

On silicon wafers having a film of DUV-30 (Brewer Science) coated to a thickness of 85 nm, the resist solutions were spin coated, then baked on a hot plate at 120° C. for 90 seconds to give resist films having a thickness of 200 nm.

The resist films were exposed by means of an $F_2$ laser exposure tool (VUVES by Litho Tech Japan Corp.) while varying the exposure dose. Immediately after exposure, the resist films were baked (PEB) at 120° C. for 90 seconds and then developed for 60 seconds with a 2.38 wt % aqueous solution of tetramethylammonium hydroxide. The film thickness was measured in different dose areas. From the residual film thickness-to-dose relationship, the sensitivity (Eth) was determined as the exposure dose giving a film thickness 0. A γ value which was the slope (tan θ) of the characteristic curve was also determined.

Separately, the resist film was exposed using a KrF scanner S203B (Nikon Corp., NA 0.68, σ0.75, ⅔ annular illumination, Cr mask). The minimum mask feature size that provided a 1:1 resolution to a 150-nm line-and-space pattern was determined and reported as threshold resolution. The results are summarized in Table 2.

TABLE 2

| Polymer (pbw) | Photoacid generator (pbw) | Basic compound (pbw) | Dissolution inhibitor (pbw) | Solvent (pbw) | Eth (mJ/cm$^2$) | γ | Threshold resolution (nm) |
|---|---|---|---|---|---|---|---|
| Polymer 1 (100) | PAG1 (4) | tributylamine (0.2) | — | PGMEA (1,000) | 8.5 | 9.0 | 130 |
| Polymer 2 (100) | PAG1 (4) | tributylamine (0.2) | — | PGMEA (1,000) | 7.0 | 9.4 | 130 |
| Polymer 3 (100) | PAG1 (4) | tributylamine (0.2) | — | PGMEA (1,000) | 8.8 | 8.8 | 130 |
| Polymer 4 (100) | PAG1 (4) | tributylamine (0.2) | — | PGMEA (1,000) | 9.5 | 10.5 | 130 |
| Polymer 5 (100) | PAG1 (4) | tributylamine (0.2) | — | PGMEA (1,000) | 10.2 | 10.7 | 130 |
| Polymer 1 (100) | PAG1 (4) | TMMEA (0.2) | — | PGMEA (1,000) | 9.5 | 12.5 | 125 |
| Polymer 1 (100) | PAG1 (4) | AAA (0.2) | — | PGMEA (1,000) | 7.5 | 9.5 | 130 |
| Polymer 1 (100) | PAG1 (4) | AACN (0.2) | — | PGMEA (1,000) | 7.6 | 10.5 | 130 |
| Polymer 1 (100) | PAG1 (4) | TMMEA (0.2) | DRI1 (10) | PGMEA (1,000) | 7.8 | 10.6 | 125 |
| Polymer 1 (100) | PAG2 (4) | TMMEA (0.2) | — | PGMEA (1,000) | 5.9 | 9.5 | 125 |
| Polymer 6 (70) + Polymer 1 (30) | PAG1 (4) | TMMEA (0.2) | — | PGMEA (1,000) | 7.6 | 11.6 | 125 |
| Polymer 6 (70) + Polymer 2 (30) | PAG1 (4) | TMMEA (0.2) | — | PGMEA (1,000) | 7.3 | 10.3 | 130 |
| Polymer 6 (70) + Polymer 3 (30) | PAG1 (4) | TMMEA (0.2) | — | PGMEA (1,000) | 7.7 | 10.1 | 125 |
| Polymer 6 (70) + Polymer 4 (30) | PAG1 (4) | TMMEA (0.2) | — | PGMEA (1,000) | 8.2 | 9.8 | 125 |
| Polymer 6 (70) + Polymer 5 (30) | PAG1 (4) | TMMEA (0.2) | — | PGMEA (1,000) | 8.5 | 11.2 | 125 |
| Comparative Polymer 1 (100) | PAG1 (4) | triethanolamine (0.2) | — | PGMEA (1,000) | 15.2 | 2.3 | 140 |

Upon exposure to VUVES, the resist compositions within the scope of the invention exerted the positive working effect that the film thickness decreased with an increasing exposure dose.

Japanese Patent Application No. 2003-363181 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer comprising recurring units of the general formula (1) and recurring units of at least one type selected from the general formulae (2a) to (2d) and having a weight average molecular weight of 1,000 to 500,000,

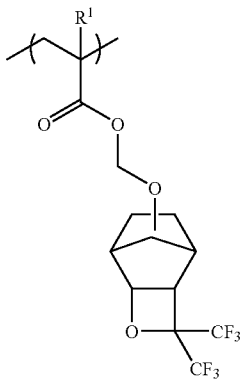

(1)

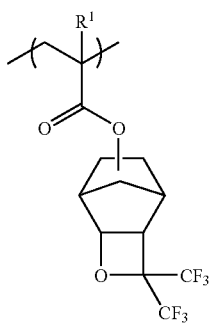

(2a)

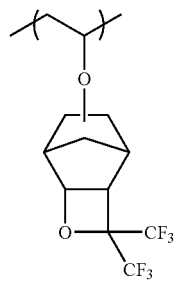

(2b)

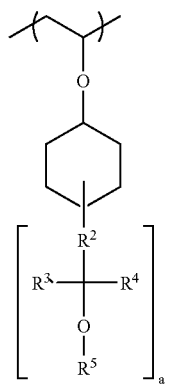

(2c)

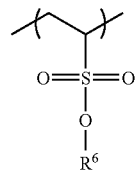

(2d)

wherein $R^1$ is a fluorine atom or a fluorinated alkyl group of 1 to 4 carbon atoms, $R^2$ is a single bond or a straight, branched or cyclic alkylene or fluorinated alkylene group of 1 to 20 carbon atoms, $R^3$ and $R^4$ each are a hydrogen atom, a fluorine atom or a straight, branched or cyclic alkyl or fluorinated alkyl group of 1 to 20 carbon atoms, at least one of $R^3$ and $R^4$ contains at least one fluorine atom, $R^5$ is hydrogen or an acid labile group, $R^6$ is an acid labile group, an adhesive group or a straight, branched or cyclic alkyl or fluorinated alkyl group of 1 to 20 carbon atoms, and "a" is 1 or 2.

2. The polymer of claim 1 wherein the acid labile group of $R^5$ and $R^6$ is selected from the class consisting of the groups of formulae (AL-1) to (AL-4):

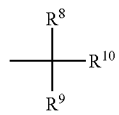

(AL-1)

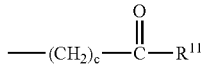

(AL-2)

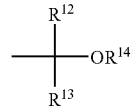

(AL-3)

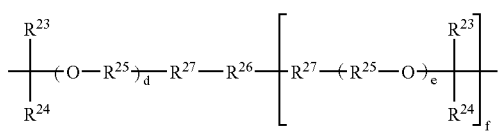

(AL-4)

wherein $R^8$, $R^9$ and $R^{10}$ may be the same or different and stand for straight, branched or cyclic hydrocarbon groups of 1 to 20 carbon atoms, which may contain a hetero atom such as oxygen, sulfur or nitrogen, or bridged cyclic hydrocarbon groups, or a pair of $R^8$ and $R^9$, $R^8$ and $R^{10}$, and $R^9$ and $R^{10}$, taken together, may form a ring of 3 to 20 carbon atoms with the carbon atom to which they are bonded, $R^{11}$ and $R^{14}$ stand for straight, branched or cyclic alkyl groups of 1 to 20 carbon atoms, which may contain a hetero atom such as oxygen, sulfur, nitrogen or fluorine, $R^{12}$ and $R^{13}$ stand for hydrogen or straight, branched or cyclic alkyl groups of 1 to 20 carbon atoms, which may contain a hetero atom such as oxygen, sulfur, nitrogen or fluorine, or a pair of $R^{12}$ and $R^{13}$, $R^{12}$ and $R^{14}$, and $R^{13}$ and $R^{14}$, taken together, may form a ring of 3 to 20 carbon atoms with the carbon atom to which they are bonded, the subscript c is an integer of 0 to 6, $R^{23}$ and $R^{24}$ are hydrogen or straight, branched or cyclic alkyl of 1 to 8 carbon atoms, or $R^{23}$ and $R^{24}$, taken together, may form a ring, with the proviso that when they form a ring, each is a straight or branched alkylene of 1 to 8 carbon atoms, $R^{25}$ is a straight, branched or cyclic alkylene of 1 to 10 carbon atoms, $R^{26}$ is a (f+1)-valent aliphatic or alicyclic saturated hydrocarbon, aromatic hydrocarbon group or heterocyclic group having 1 to 50 carbon atoms which may be separated by a hetero atom, and in which some of the hydrogen atoms attached to the carbon atoms may be substituted with hydroxyl, carboxyl, carbonyl or fluorine, $R^{27}$ is —CO—O—, —NHCO—O— or —NHCONH—, the subscripts d and e each are an integer from 0 to 10, and f is an integer from 1 to 7.

3. The polymer of claim 1 wherein the adhesive group of $R^6$ is selected from the class consisting of groups of the following formulae:

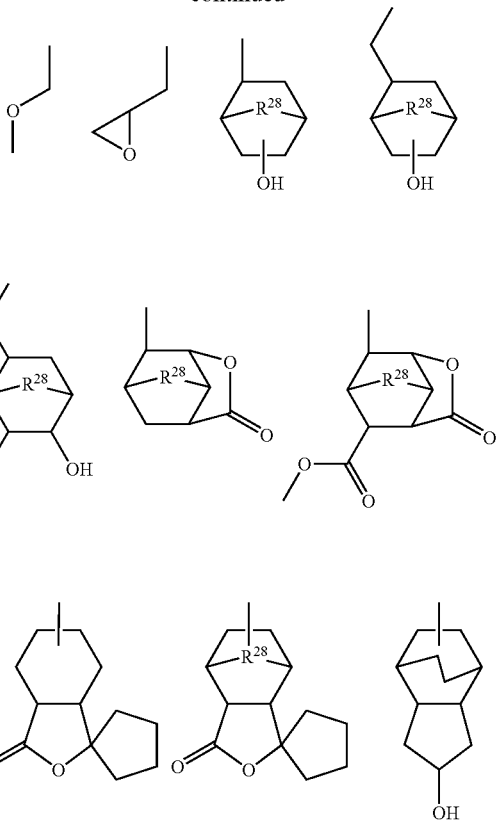

wherein $R^{28}$ is a methylene group, oxygen atom or sulfur atom, and Me is methyl.

4. The polymer of claim 1 which further comprises at least one additional recurring unit selected from the class consisting of the following recurring units:

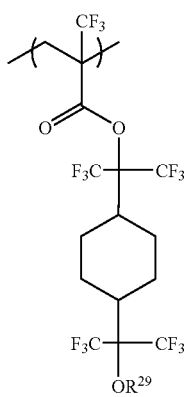

wherein $R^{29}$ is hydrogen or an acid labile group, $R^{30}$ to $R^{34}$ each are hydrogen, fluorine or a fluoroalkyl group of 1 to 4 carbon atoms, at least one of $R^{30}$ to $R^{34}$ contains at least one fluorine atom, and $R^{35}$ and $R^{36}$ each are hydrogen, methyl or trifluoromethyl.

5. A resist composition comprising
(A) the polymer of claim 1,
(B) an organic solvent and
(C) a photoacid generator,
the composition being of chemical amplification positive type.

6. The resist composition of claim 5, further comprising (D) a basic compound.

7. The resist composition of claim 5, further comprising (E) a dissolution inhibitor.

8. The resist composition of claim 6, further comprising (E) a dissolution inhibitor.

9. A resist composition comprising,
(A) a mixture of the polymer of claim 1 and a polymer comprising recurring units of the general formulae (3a) to (3c):

(3a)

(3b)

(3c)

wherein $R^7$ is hydrogen or an acid labile group, the subscripts b1, b2 and b3 are numbers satisfying $0<b1<1$, $0<b2<1$, $0\leqq b3<1$, and $0<b1+b2+b3\leqq 1$, (B) an organic solvent and
(C) a photoacid generator,
the composition being of chemical amplification positive type.

10. The resist composition of claim 9, further comprising (D) a basic compound.

11. The resist composition of claim 9, further comprising (E) a dissolution inhibitor.

12. The resist composition of claim 10, further comprising (E) a dissolution inhibitor.

13. A process for forming a resist pattern comprising the steps of:
applying the resist composition of claim 5 onto a substrate to form a coating,
heat treating the coating and then exposing it to high-energy radiation in a wavelength band of 100 to 180 nm or 1 to 30 nm through a photomask, and
optionally heat treating the exposed coating and developing it with a developer.

14. The pattern forming process of claim 13, wherein the high-energy radiation is an $F_2$ laser beam, $Ar_2$ laser beam or soft x-ray.

15. A process for forming a resist pattern comprising the steps of:
applying the resist composition of claim 9 onto a substrate to form a coating,
heat treating the coating and then exposing it to high-energy radiation in a wavelength band of 100 to 180 nm or 1 to 30 nm through a photomask, and
optionally heat treating the exposed coating and developing it with a developer.

16. The pattern forming process of claim 15, wherein the high-energy radiation is an $F_2$ laser beam, $Ar_2$ laser beam or soft x-ray.

* * * * *